(12) United States Patent
Wu et al.

(10) Patent No.: US 11,489,009 B2
(45) Date of Patent: Nov. 1, 2022

(54) INTEGRATING EMBEDDED MEMORY ON CMOS LOGIC USING THIN FILM TRANSISTORS

(71) Applicant: International Business Machines Corporation, Armonk, NY (US)

(72) Inventors: Heng Wu, Guilderland, NY (US); Julien Frougier, Albany, NY (US); Bruce B. Doris, Slingerlands, NY (US); Chen Zhang, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 16/823,311

(22) Filed: Mar. 18, 2020

(65) Prior Publication Data
US 2021/0296396 A1    Sep. 23, 2021

(51) Int. Cl.
| H01L 27/22 | (2006.01) |
| H01L 27/24 | (2006.01) |
| G11C 13/00 | (2006.01) |
| H01L 43/08 | (2006.01) |
| G11C 11/16 | (2006.01) |
| H01L 45/00 | (2006.01) |

(52) U.S. Cl.
CPC ............ *H01L 27/228* (2013.01); *G11C 11/16* (2013.01); *G11C 13/0004* (2013.01); *H01L 27/2436* (2013.01); *H01L 43/08* (2013.01); *H01L 45/06* (2013.01)

(58) Field of Classification Search
CPC ... H01L 27/228; H01L 27/2436; H01L 43/08; H01L 45/06; G11C 11/16; G11C 13/0004

USPC ......................................................... 257/421
See application file for complete search history.

(56) References Cited

U.S. PATENT DOCUMENTS

| 6,838,721 B2 | 1/2005 | Garni |
| 6,882,566 B2 | 4/2005 | Nejad |
| (Continued) | | |

FOREIGN PATENT DOCUMENTS

| CN | 107431073 A | 12/2017 |
| WO | 2018004588 A1 | 1/2018 |
| WO | 2019066961 A1 | 4/2019 |

OTHER PUBLICATIONS

Li, et al, "Nanometre-thin indium tin oxide for advanced high-performance electronics", Abstract Only, Nature Materials, 18, 2019, pp. 1091-1097, <https://doi.org/10.1038/s41563-019-0455-8>.

*Primary Examiner* — Jami Valentine Miller
(74) *Attorney, Agent, or Firm* — Alexander G. Jochym (57) ABSTRACT

A semiconductor structure that includes a metal layer in a first interlayer dielectric that is above a semiconductor device. The semiconductor structure includes an embedded memory device on the metal layer. The embedded memory device has a first metal contact surrounded by a second interlayer dielectric. Additionally, the semiconductor structure includes a thin film transistor on the first metal contact. The thin film transistor is surrounded by a third interlayer dielectric. The third interlayer dielectric is over a portion of the embedded memory device and a portion of the second interlayer dielectric. The semiconductor structure includes a first portion of a channel of the thin film transistor covered a gate structure, where the channel is a layer of indium tin oxide.

15 Claims, 5 Drawing Sheets

(56) References Cited

U.S. PATENT DOCUMENTS

| | | |
|---|---|---|
| 8,649,203 B2 | 2/2014 | Chung |
| 8,963,114 B2 | 2/2015 | Liao |
| 9,165,930 B2 * | 10/2015 | Yi ................. H01L 45/146 |
| 9,853,053 B2 | 12/2017 | Lupino |
| 10,008,387 B1 | 6/2018 | Wang |
| 10,297,580 B2 | 5/2019 | Or-Bach |
| 2015/0069514 A1 * | 3/2015 | Shih ............... H01L 21/47635 |
| | | 257/350 |
| 2018/0122825 A1 | 5/2018 | Lupino |
| 2019/0131187 A1 | 5/2019 | Le |
| 2019/0326296 A1 | 10/2019 | Wang |
| 2020/0194434 A1 * | 6/2020 | Alzate Vinasco .. H01L 21/8221 |
| 2021/0336130 A1 * | 10/2021 | Chien ................. H01L 43/02 |
| 2021/0375926 A1 * | 12/2021 | Mehandru ...... H01L 29/42392 |

* cited by examiner

INTEGRATING EMBEDDED MEMORY ON CMOS LOGIC USING THIN FILM TRANSISTORS

BACKGROUND OF THE INVENTION

The present invention relates generally to the field of semiconductor memory device technology and more particularly to integrating thin film transistors using thin indium tin oxide, embedded non-volatile memory and complementary metal-oxide-semiconductor (CMOS) logic in semiconductor device structures.

Indium tin oxide (ITO) is widely used in optoelectronics due to its high optical transmittance and electrical conductivity, however the limited doping ability of ITO has restricted ITO applications as a semiconductor material. A recent discovery has determined that that very thin layers of ITO can be used as an effective semiconductor material in various semiconductor devices. Short-channel active transistors based on an ultra-thin ITO channels using high-quality, low-k dielectric materials, such as, lanthanum-doped hafnium oxide dielectrics, can provide electrical performance comparative to that of existing metal oxides and emerging two-dimensional materials. The unique wide bandgap and low dielectric constant of ITO provide prospects for future scaling below the 5 nm regime for advanced low-power electronics.

SUMMARY

Embodiments of the present invention provide a semiconductor structure that includes a metal layer in a first interlayer dielectric that is above a semiconductor device. The semiconductor structure includes an embedded memory device on the metal layer with a first metal contact is surrounded by a second interlayer dielectric. Additionally, the semiconductor structure includes a thin film transistor on the first metal contact. The thin film transistor is surrounded by a third interlayer dielectric that is over a portion of the embedded memory device and a portion of the first interlayer dielectric. The semiconductor structure includes a first portion of a channel of the thin film transistor covered a gate structure, where the channel is a layer of indium tin oxide.

Embodiments of the present invention provide a semiconductor structure including a metal layer in a first interlayer dielectric that is above a semiconductor device. The semiconductor structure includes a thin-film transistor surrounded by a second interlayer dielectric. The second interlayer dielectric is over the metal layer and over a portion of the first interlayer dielectric. The semiconductor structure includes a channel of the thin-film transistor that composed of indium tin oxide and is over the metal layer and a portion of the first interlayer dielectric. The semiconductor structure includes a gate structure surrounded by a metal contact, where the gate structure is over a portion of the channel of the thin-film transistor. The semiconductor structure includes the thin film transistor that is in one of a middle of line (MOL) wiring layer or a backend of line (BEOL) wiring layer. The semiconductor structure includes an embedded memory device over the metal contact. The embedded memory device is surrounded by a third interlayer dielectric.

Embodiments of the present invention provide a method of forming a semiconductor structure, the method includes depositing a first layer of indium tin oxide, a first gate dielectric layer, and a first gate layer over a first interlayer dielectric and a portion of a middle of the line metal layer above a semiconductor device, where the first layer of indium tin oxide is a channel over a portion of a metal layer, a portion of the first interlayer dielectric, and an underlying semiconductor device. The method includes selectively patterning the first layer of indium tin oxide, the first gate layer, and the first gate layer and forming a first sidewall spacer around the first gate layer. Furthermore, the method includes depositing a second gate dielectric on the first gate layer and the first sidewall spacer and then, sequentially depositing a second layer of indium tin oxide, a third gate dielectric layer, a second gate layer over the second gate dielectric layer. The method includes selectively patterning the second gate dielectric layer, the second layer of indium tin oxide, the third gate dielectric layer and the second gate layer and forming a second sidewall spacer around the second gate layer to form a multichannel thin-film transistor. The method includes depositing a second interlayer dielectric over the thin-film multichannel transistor and forming a metal contact on one side of the thin-film multichannel transistor through the second interlayer dielectric. The method includes forming an embedded memory device on the metal contact.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Embodiments of the present invention recognize that emerging memory devices, such as magnetoresistive random access memory (MRAM) devices, phase-change memory (PCRAM, also known as PCM, PCME, or PRAM), and resistive random access memory (ReRAM), are increasingly used to replace embedded dynamic random-access memory (DRAM) for high performance computer computations. Embodiments of the present invention recognize that current embedded memory design practice places memory cells close to the front end of the line (FEOL) semiconductor devices to reduce the electrical resistance when connecting the memory devices to FEOL semiconductor devices. Furthermore, embodiments of the present invention recognize embedded memory devices, as currently designed, usually require a high driver current for switching large FEOL transistors commonly used with the embedded memory devices. Large FEOL transistors, used as access transistors for embedded memory devices, consume a large amount of area within a substrate. Additionally, embodiments of the present invention recognize placing the embedded memory in close proximity to the large FEOL transistor occupies additional semiconductor device space that could otherwise by used for logic circuits. Additionally, embodiments of the present invention recognize that placing stacked embedded memory on top of logic circuits, such as access transistors, is highly desirable for optimum performance of artificial intelligence and the internet of things (IOT) applications.

Embodiments of the present invention provide a method of forming logic circuits such as access transistors in the backend of the line (BEOL) instead of using transistors formed in the FEOL (i.e., FEOL transistors as access transistors). Embodiments of the present invention provide a method of forming access transistors in the BEOL that can be either on top of the embedded memory devices or below the embedded memory devices. Embodiments of the present invention form the access transistors in the BEOL using ultra-thin indium tin oxide (ITO) films as a device channel.

Embodiments of the present invention disclose a method of forming a semiconductor device such as an access transistor using an ultra-thin ITO film in the BEOL or middle of the line (MOL) wiring that is below an embedded memory device. Additionally, embodiments of the present invention provide a method of forming the semiconductor device in the BEOL or MOL that is above the embedded memory device. Furthermore, embodiments of the present invention provide a method of using a single ITO film in the access transistor or a method of stacking multiple layers of ultra-thin ITO films when forming the access transistors. Embodiments of the present invention using ultra-thin ITO films as a device channel in an access transistor formed in the BEOL or MOL instead of traditional FEOL transistors without ITO channels, saves cell area for logic devices in the FEOL wiring and enables additional flexibility for circuit design.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art, for semiconductor logic devices and embedded memory devices, and only so much of the commonly practiced process steps are included as are necessary for an understanding of the described embodiments. The figures represent cross-section portions of an embedded memory device (e.g., a MRAM device) and a thin film transistor (TFT) after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

Figure 1:
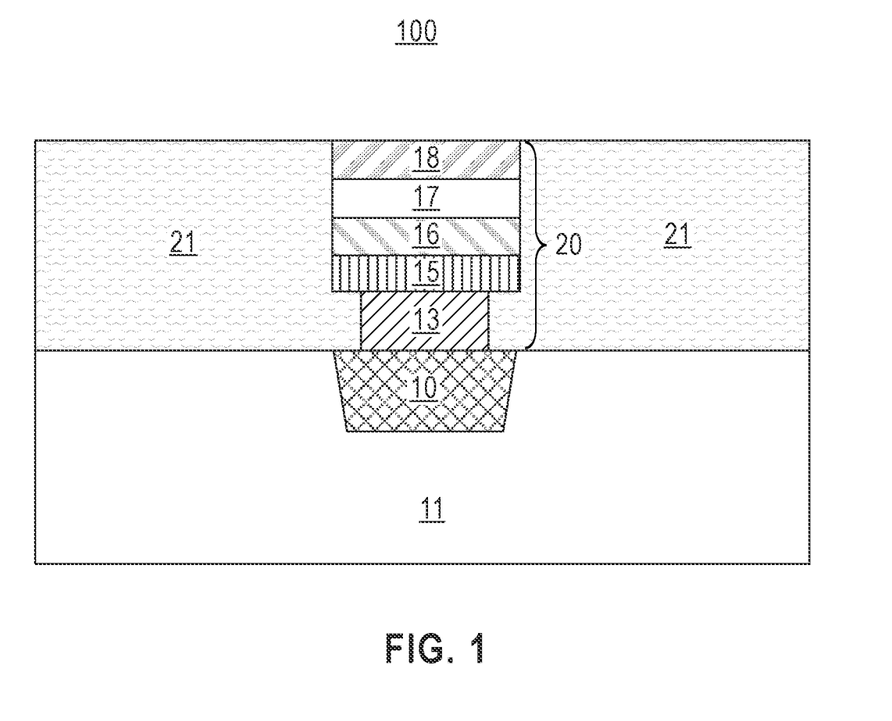
FIG. 1 is a cross-sectional view of a semiconductor structure after forming a magnetoresistive random access memory (MRAM) device on a metal wiring layer above a logic device in accordance with an embodiment of the present invention.

FIG. 1 is a cross-sectional view of semiconductor structure 100 after forming MRAM device 20 on Mx 10 in accordance with an embodiment of the present invention. Mx 10 can be a portion of a metal wiring layer in a FEOL, MOL or BEOL process in semiconductor structure 100. For example, when Mx 10 is a MOL wiring layer, Mx 10 may be one of metal layer M1 to M10 but, is not limited to these metal wiring layers (e.g., Mx 10 may be a higher metal wiring layer than M50). Mx 10 may be composed of known metal materials, such as, but not limited to tungsten, copper, cobalt, or ruthenium, used in metal layers in a semiconductor structure (e.g., M1 metal layer, M2 metal layer, etc.). Interlayer dielectric (ILD) 11 and ILD 21 may be composed of any known ILD material, such as, $SiO_2$ or other dielectric material. In one embodiment, Mx 10 is a metal contact of an underlying semiconductor device (e.g., MRAM device 20 is directly on or connecting to the underlying semiconductor device).

In various embodiments, Mx 10 is over an underlying logic device. Mx 10 can be a wiring layer above a logic device (not depicted in FIG. 1). In some embodiments, Mx 10 is directly connected to an underlying logic device. In one embodiment, Mx 10 contacts top electrode 18. In another embodiment, Mx 10 is not connected to an underlying logic device. The underlying logic device may be a metal-oxide-semiconductor field-effect transistor (MOSFET) device, or CMOS device based on various architectures such as a planar-FET, finFET, horizontal Gate-All-Around (h-GAA) FET or vertical Gate-All-Around (v-GAA) FET but is not limited to these semiconductor devices. In various embodiments, the underlying device resides in FEOL wiring of semiconductor structure 100.

MRAM device 20 may be formed using known semiconductor processes for MRAM device formation. MRAM device 20 can be formed by sequentially depositing bottom electrode 13, reference layer 15, tunneling barrier layer 16, freelayer 17, and top electrode 18 followed by photolithography patterning and an anisotropic etch (e.g., ion beam etch) to form the MRAM device 20. In various embodiments, MRAM device 20 is composed of at least bottom electrode 13, reference layer 15, tunneling barrier layer 16, freelayer 17, and top electrode 18 but, is not limited to these layers. In some embodiments, a hardmask layer is deposited over top electrode 18. A sidewall spacer (not depicted in FIG. 1) may be deposited around MRAM device 20 using known processes. ILD 21 can be deposited around MRAM device 20 and on ILD 11 and over portions of Mx 10. In one embodiment, ILD 21 covers ILD 11 but is not over a portion of Mx 10. A planarization of semiconductor structure 100 with ILD 21 can occur using a chemical-mechanical polish (CMP).

In some embodiments, MRAM device 20 is composed of multiple stacked layers of reference layer 15, tunneling barrier layer 16, and freelayer 17 over bottom electrode 13 and under top electrode 18. MRAM device 20 is not limited to these layers or to this configuration of layers but, maybe any known semiconductor structure for an embedded MRAM device.

While depicted in FIG. 1 as a MRAM, MRAM device 20 can be any known embedded memory device formed using known embedded memory device materials and processes. In other embodiments, MRAM device 20 is a different type of embedded memory device, such as, a PCRAM or an ReRAM that can replace a DRAM or SRAM. In these examples, reference layer 15, tunneling barrier layer 16, and freelayer 17 over bottom electrode 13 can be replaced with a polycrystalline material, such as, polycrystalline chalcogenide for a PCRAM device or replaced with phase-change chalcogenides such as $Ge_2Sb_2Te_5$ or AgInSbTe, binary transition metal oxides such as NiO or TiO, or two dimensional (layered) insulating materials like hexagonal boron nitride for ReRAM devices. The embedded memory device such as a PCRAM or ReRAM can be formed using any known semiconductor processes for embedded memory devices.

Figure 2:
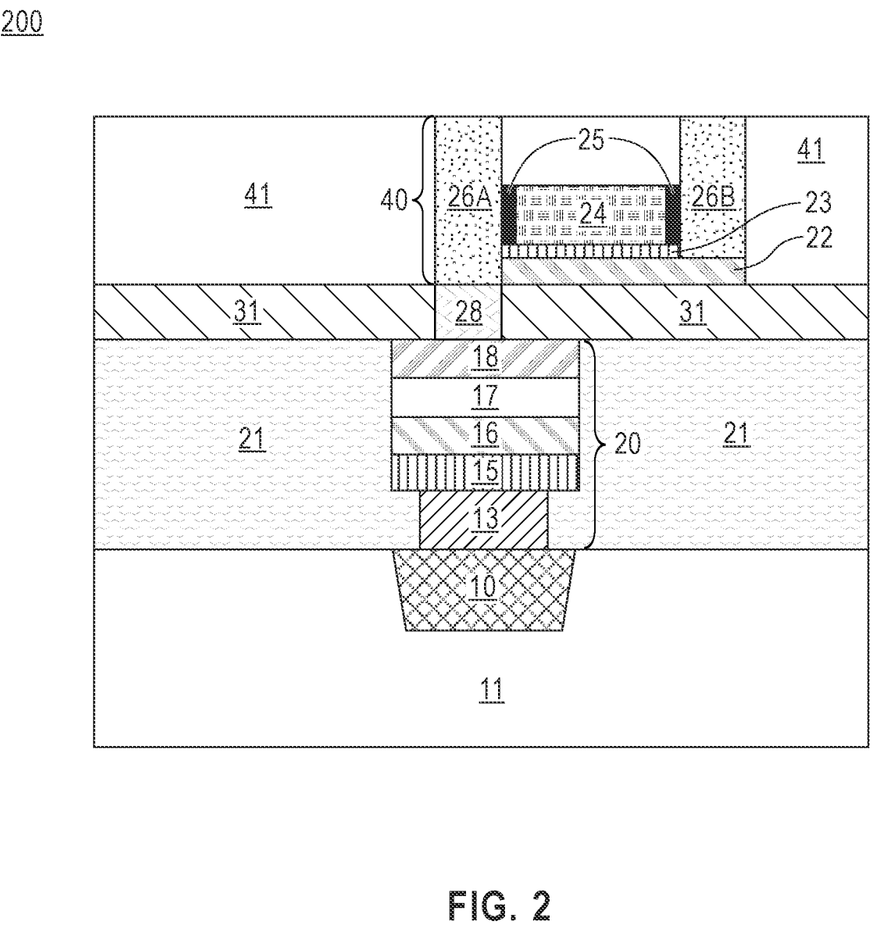
FIG. 2 is a cross-sectional view of the semiconductor structure after forming a thin-film transistor (TFT) over the MRAM device on the metal layer above the logic device in accordance with an embodiment of the present invention.

FIG. 2 is a cross-sectional view of semiconductor structure 200 after forming a thin-film transistor (TFT) 40 over MRAM device 20 in accordance with an embodiment of the present invention. As depicted in FIG. 2, TFT 40, formed using an ultra-thin layer of an ITO film as ITO channel 22, connects to MRAM device 20 by metal contact 28. In various embodiments, MRAM device 20 resides in either the MOL or the BEOL wiring.

A layer of ILD 31 can be deposited over ILD 21 and top electrode 18 of MRAM device 20. In various embodiments, a thickness of ILD 31 is greater than 10 nm. Metal contact 28 can be formed over top electrode 18 of MRAM device 20 using known semiconductor processes for semiconductor contact formation (e.g., selective etch of ILD 31, contact metal deposition, and chemical-mechanical polish (CMP)). Metal contact 28 may be composed of any known contact metal for a semiconductor device (e.g., copper).

A thin layer of ITO material is deposited over a portion of ILD 31 for ITO channel 22. In various embodiments, a thickness for ITO channel 22 is in the range of 3 to 30 nm. ITO channel 22 can be deposited by known deposition processes, such as, plasma vapor deposition (PVD), atomic layer deposition (ALD), or chemical vapor deposition (CVD). Known lithography methods pattern the ITO material. In various embodiments, a selective etch of the layer of ITO material forms ITO channel 22. After forming ITO channel 22, a width of ITO channel 22 (i.e., horizontal measurement from left to right measurement in FIG. 2) can be in the range of 100 to 500 nm. A length of ITO channel 22 can be in the range of 50 to 200 nm (i.e., a horizontal measurement of length out of the paper that is perpendicular to the width, and in the same plane as the width).

In various embodiments, a portion of the ITO material for ITO channel 22 remains on a portion of ILD 31 immediately adjacent to metal contact 28 after patterning. In some embodiments, a portion of ITO channel 22 material remains over a portion of metal contact 28 and over a portion of ILD 31 after patterning. In one embodiment, a portion of ITO channel 22 covers metal contact 28 and is over a portion of ILD 31.

In various embodiments, a layer of gate dielectric material is deposited over ITO channel 22. Gate dielectric 23 may be any gate dielectric material, such as, $SiO_2$. In various embodiments, gate dielectric 23 is a high k dielectric material (e.g., $HfO_2$, $ZrO_2$, $Al_2O_3$, $TiO_2$, $LaAlO_3$, etc.). A gate material, such as TiAlN, W, TiAlC, etc., is deposited over gate dielectric 23. Using known lithographic processes, a selective etch of the gate material forms gate 24. Sidewall spacer 25 can be deposited on the vertical edges of gate 24 using known sidewall spacer techniques. Exposed horizontal surfaces of gate dielectric 23, gate 24, and sidewall spacer 25 can be selectively etched. A thickness of sidewall spacer 25 can be in the range of 5 to 20 nm. In various embodiments, sidewall spacer 25 can be SiN, SiBCN, another nitride material or other dielectric material used in semiconductor spacers. In various embodiments, gate dielectric 23, gate 24, and sidewall spacer 25 form a gate structure.

ILD 41 may be deposited over ILD 31 and over TFT 40 (e.g., over gate 24, sidewall spacer 25, and ITO channel 22). Metal contacts 26A and 26B can be formed using known processes. A portion of ILD 41 over metal contact 28 can be selectively etched to contact a top surface of metal contact 28 that connects to MRAM device 20. A portion of ILD 41 is over a portion of ITO channel 22 (e.g., depicted on the right side of the gate structure). A layer of metal for metal contacts 26A and 26B can be deposited over semiconductor structure 200 using known processes and then, planarized using CMP to remove the deposited metal from top surfaces of ILD 41. After planarization, metal contacts 26A and 26B remain in ILD 41. Metal contact 26A connects to the top surface of metal contact 28 and metal contact 26B can connect to a side of ITO channel 22 (e.g., contacts 26A and 26B can contact to a source or drain in TFT 40). In another embodiment, ITO channel 22 extends beyond gate dielectric 23 and sidewall spacer 25 on both sides of the gate structure. In this embodiment, contact 26B connects to ITO channel 22 rather than metal contact 28.

In this manner, TFT 40 with ITO channel 22 is formed over MRAM device 20 and MRAM device 20 is formed on a metal wiring layer, Mx 10 that is over a logic device. As previously discussed, Mx 10 can be in FEOL, MOL, or BEOL wiring and similarly, MRAM device 20 can be formed in FEOL, MOL, or BEOL. In various embodiments, Mx 10 can be in MOL wiring and MRAM device 20 can be in either MOL or BEOL wiring. In one embodiment, Mx 10 is in FEOL and MRAM device 20 is in MOL or BEOL. In other embodiments MRAM device 20 can be another type of embedded memory device (e.g., PCRAM, ReRAM, etc.). In one embodiment, metal contact 26A of TFT 40 is formed directly on top electrode 18. In this embodiment, one of metal contacts 26A or 26B is over top electrode 18 adjacent to an edge of top electrode 18 such that all of ITO channel 22 is over a portion of ILD 31.

As previously discussed with regard to MRAM device 20 above in FIG. 1, MRAM device 20 can be another type of embedded memory device (e.g., PCRAM, ReRAM, etc.). In various embodiments, TFT 40 with ITO channel 22 is an access transistor for MRAM device 20.

Figure 3:
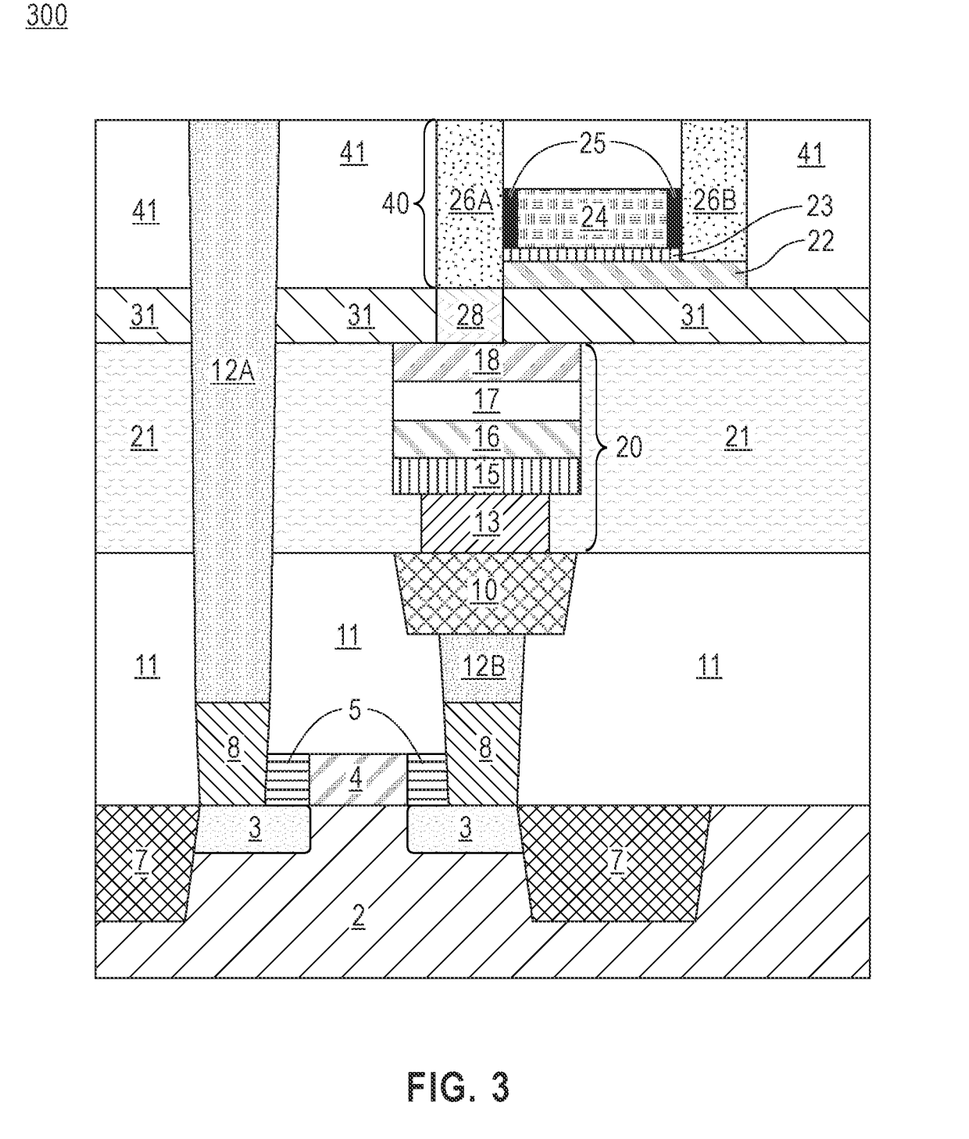
FIG. 3 is a cross-sectional view of the semiconductor structure after forming a thin-film transistor (TFT) over the MRAM device on a metal wiring layer over a front-gated transistor in accordance with an embodiment of the present invention.

FIG. 3 is a cross-sectional view of semiconductor structure 300 after forming TFT 40 over MRAM device 20 on Mx 10 that is over front-gated transistor 30 in accordance with an embodiment of the present invention. As depicted, FIG. 3 is an illustration of one example of MRAM device 20 on Mx 10, a metal wiring layer above a logic device, where the logic device is depicted as front-gated transistor in FEOL wiring An access transistor, TFT 40, that is directly over MRAM device 20 in FIG. 3. FIG. 3 depicts one specific example of a logic component that can be under MRAM device 20 and TFT 40, In other examples, front-gated transistor could be a metal-oxide-semiconductor field-effect transistor (MOSFET) device, or CMOS device based on various architectures such as a planar-FET, finFET, horizontal gate-all-around (h-GAA) FET or vertical gate-all-around (v-GAA) FET but is not limited to these semiconductor devices.

In various embodiments, the front-gated transistor includes a channel in semiconductor substrate 2, source/drains 3 surrounded by shallow trench isolation (STI) 7, gate 4 over a gate dielectric (not depicted), sidewall spacers 5, metal layer 8 with a contact silicide (not depicted). In some embodiments, metal layer 8 connects directly to Mx 10 under and connecting to MRAM device 20 (e.g., metal contact 28B is not present). In one embodiment, metal layer 8 connects directly to bottom electrode 13 of MRAM device 20.

STI 7 is formed on outside of front-gated transistor 30 on either side source/drain 8 and extending deeper into semiconductor substrate 2. The front-gated transistor can be formed with known semiconductor processes for transistor formation. The front-gated transistor can be a logic component. ILD 11 can be deposited over exposed surfaces of semiconductor structure 300 and metal contact 12A is formed. While the underlying semiconductor device in FIG. 3 is depicted as a front-gated transistor, in other examples the underlying semiconductor device can be another type of device (e.g., finFET).

A layer of ILD 11 can be deposited over ILD 9 and metal contact 12A and Mx 10 formed using known processes (e.g., patterning, etch, metal deposit, CMP). Mx 10 is a metal wiring layer over the front-gated transistor. A portion of Mx 10 resides over metal contact 12B connecting to metal contact 8 in the front-gated transistor.

MRAM device 20 can be formed over Mx 10 using known processes discussed with reference to FIG. 1. As depicted, bottom electrode 13 of MRAM device 20 is formed over a portion of Mx 10. MRAM device 20 is essentially the same as MRAM device 20 in FIGS. 1 and 2 (e.g., can be formed with the same materials, sizes, and processes). ILD 31 can be deposited over ILD 21 and top electrode 18 of MRAM device 20. Metal contact 28 is formed over top electrode 18 using known semiconductor contact processes. As previously discussed with respect to FIG. 1, MRAM device 20 can be another type of embedded memory device (e.g., PCRAM, etc.) formed using known materials and processes.

A layer of ITO material is deposited over ILD 31 and metal contact 28. Using the processes and materials as discussed previously with reference to FIG. 2, TFT 40 can be formed connecting to metal contact 28. TFT 40 in FIG. 3 is essentially the same as TFT 40 in FIG. 2 and can be formed with the same materials, processes, and dimensions as discussed with reference to FIG. 2. As previously discussed in FIG. 2, ILD 41 is deposited and metal contacts 26A and 26B are formed using known semiconductor processing techniques.

As depicted in FIG. 3, the front-gated transistor connects from metal layer 8 through metal contact 12B to Mx 10 but, is not limited to using metal contact 12B (e.g., metal contact 12A can be used). Bottom electrode 13 in MRAM device 20 contacts Mx 10 in FIG. 3 and MRAM device 20 connects to TFT 40 through metal contact 28. In this manner, FIG. 3 depicts TFT 40 with ITO channel 22 over MRAM device 20 connecting to a front-gated transistor. While FIG. 3 depicts a front-gated transistor as the underlying semiconductor device in the FEOL where MRAM device 20 and TFT 40 may be a part of FEOL wiring layers, in other embodiments, MRAM device 20 and TFT 40 both reside in one of MOL wiring layers or BEOL wiring layers. In an embodiment, MRAM device 20 and TFT reside in a combination of MOL and BEOL (e.g., MRAM device 20 in MOL and TFT 40 in BEOL).

Figure 4:
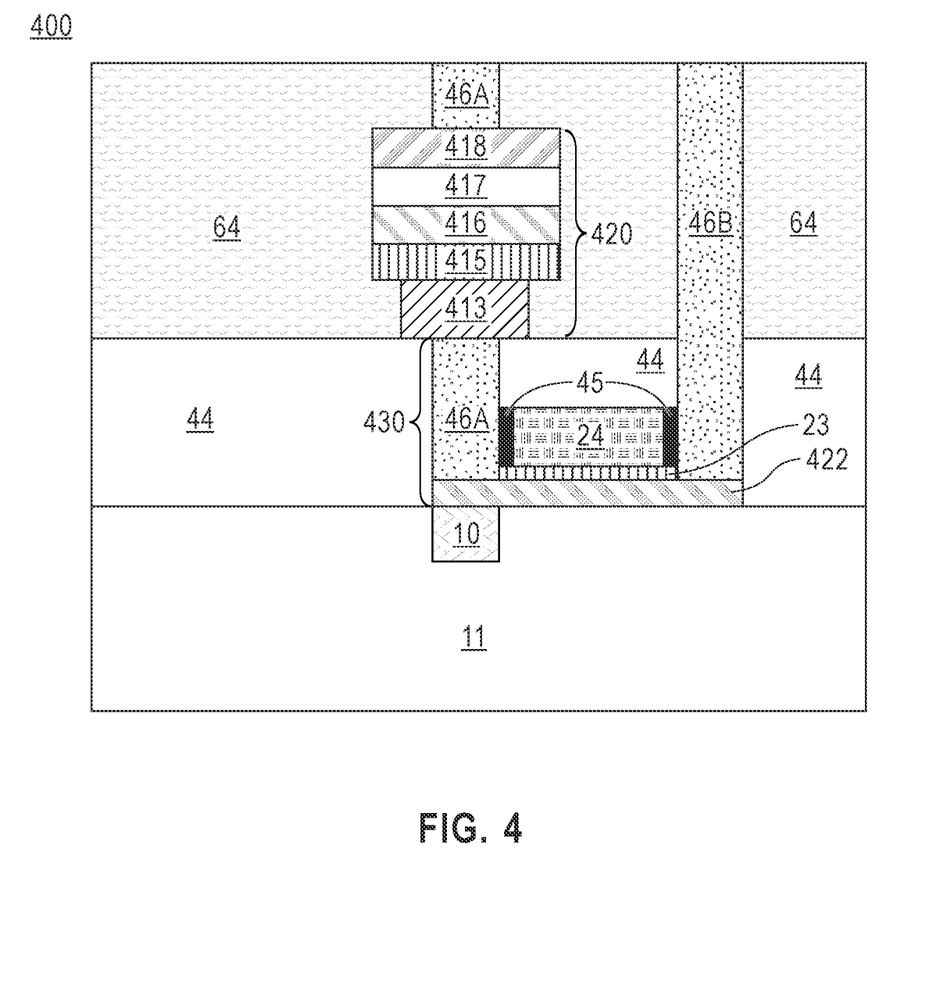
FIG. 4 is a cross-sectional view of the semiconductor structure after forming a TFT using ITO over a metal wiring layer and after forming a MRAM device above the TFT in accordance with an embodiment of the present invention.

FIG. 4 is a cross-sectional view of semiconductor structure 400 after forming MRAM device 420 above TFT 430 in accordance with an embodiment of the present invention. MRAM device 420 is essentially the same as MRAM device 20 in FIGS. 1-3 except MRAM device 420 is formed, with similar processes, over TFT 430 instead of over Mx 10 and ILD 11.

In various embodiments, TFT 430 is formed over Mx 10 and ILD 11. As previously discussed, Mx 10 can be a metal wiring layer over logic circuits and/or semiconductor devices in FEOL. In various embodiments, TFT 430 is in either MOL or BEOL. TFT 430 can be over FEOL logic circuits. In an embodiment, TFT 40 connects directly to a metal contact or electrode of an underlying FEOL semiconductor device.

TFT 430 can be formed with similar processes as TFT 40 in FIG. 2. For example, a very thin layer of ITO (e.g., 3 to 30 nm thick) can be deposited over Mx 10 and ILD 11. A selective etch may remove portions of the layer of ITO material to form ITO channel 422 as previously discussed in detail with respect to FIG. 2. ITO channel 422 may be a width of 100 to 200 nm and a length of 50 to 200 nm (i.e., the length is in the same plane as the width but, is perpendicular to the width or measured out of the plane of the paper). Gate dielectric 23 can be deposited on ITO channel 422 with gate 24 deposited over gate dielectric 23. A selective etch of gate dielectric 23 and gate 24 occurs and sidewall spacer 45 can be deposited. ILD 44 can be deposited over portions of ILD 11, gate 24, sidewall spacer 45, and ITO channel 422. Using known processes to form metal contacts in semiconductor devices, a selective etch of portions of ILD 44 exposing a portion of ITO channel 422 can occur followed by contact metal deposition. A CMP may remove the contact metal from ILD 44 to form metal contact 46A connecting to top electrode 418 of MRAM device 420.

MRAM device 420 can be formed on metal contact 46A using known processes discussed in detail with respect to forming MRAM device 20 in FIG. 1. MRAM device 420 is essentially the same as MRAM device 20 formed on Mx 10 rather than on metal contact 46A (e.g., uses same materials, processes, and similar dimensions as MRAM device 20). MRAM device 420 can be composed of top electrode 418, freelayer 417, tunneling barrier 416, reference layer 415 and bottom electrode 4133. In an embodiment, metal contact 46A is formed connecting to ITO channel 422 adjacent to the gate structure of TFT 430 through ILD 44. As previously discussed, MRAM device 420 may be composed of many layers or MRAM device 420 can be a different type of embedded memory device (e.g., ReRAM).

After formation of MRAM device 420, ILD 544 can be deposited over semiconductor structure 400. Metal contact 46B connecting to ITO channel 422 can be formed. TFT 430 and MRAM device 420 can be formed in one of MOL or BEOL. TFT 430 and MRAM device 420 can be formed over a FEOL semiconductor device. In an embodiment, TFT 430 can be formed MOL and MRAM device 420 can be formed in BEOL.

Figure 5:
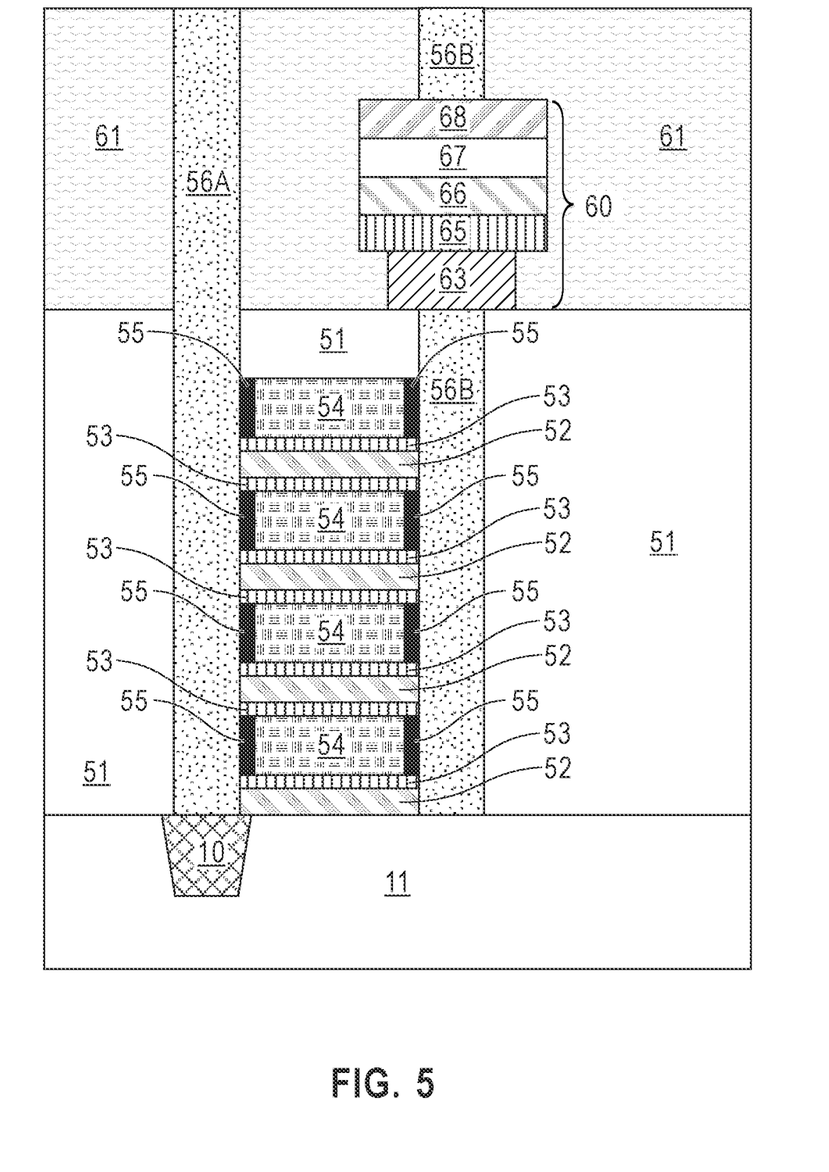
FIG. 5 is a cross-sectional view of the semiconductor structure after forming a multichannel TFT using a plurality of ITO channels over a metal wiring layer in accordance with an embodiment of the present invention.

FIG. 5 is a cross-sectional view of semiconductor structure 500 after forming multichannel TFT 50 using a plurality of ITO channels 52 over Mx 10 in accordance with an embodiment of the present invention. In various embodiments, MRAM 60 is formed over multichannel TFT 50. MRAM 60 is essentially the same as MRAM device 20 and can be formed with the same processes, materials and similar dimensions to MRAM device 20.

Multichannel TFT 50 can be formed by sequentially depositing multiple layers of ITO material surrounded by gate dielectric 53. Each ITO channel of ITO channels 52 may be further separated by gate 54 above each gate dielectric 53. Using the processes previously discussed with reference to FIG. 2, a first layer of ITO material (e.g., 3 to 30 nm thick) is deposited over ILD 11 and Mx 10 to form a first channel of ITO channels 52. A layer of gate dielectric 53 can be deposited over the first channel of ITO channels 52. Gate 54 is deposited over gate dielectric 53. The materials, processes, and material thickness of each layer of multichannel TFT 50 are essential the same as those of TFT 40 of FIG. 2. A selective etch of gate 54 occurs. Sidewall spacer 55 can be formed using known sidewall spacers processes (e.g., deposition and etch). Using standard lithograph and etch processes, exposed portions of the first channel of ITO channels 52 and gate dielectric 53 are removed. A width of the first channel of ITO channels 52 may be less than the width of ITO channel 22 in FIG. 2. For example, a typical channel width of multichannel TFT 50 is in the range of 40 to 120 nm.

A second layer of ITO material can be deposited over gate dielectric 53 and a top surface of semiconductor structure 500. Gate dielectric 53 is deposited over the second layer of ITO material forming a second channel of ITO channels 52. Gate 54 can be deposited over gate dielectric 53 on the second channel. Gate 54 can be selectively etched and sidewall spacer 55 formed around gate 54. In various embodiments, gate dielectric 53, gate 54, and sidewall spacer 55 form a gate structure. Using standard lithograph and etch processes, exposed portions of the second channel of ITO channels 52 and gate dielectric 53 are removed.

The processes used to form the second channel of ITO channels 52 and to form gate 54 with sidewall spacers 55 and gate dielectric 53 can be repeated multiple times. For example, multichannel TFT 50 may have 2 to 5 of ITO channels 52 but, is not limited this number of channels (e.g., there may be greater than 5 ITO channels 52).

Once a desired number of ITO channels and gate 54 have been formed, a layer of ILD 51 can be deposited over the top gate 54, top sidewall spacer 55 surrounding each of sidewall spacers 55 and surrounding exposed side edges of ITO channels 52 and gate dielectric 53. Using known methods, metal contact 56B can be formed over ILD 11. In an embodiment, metal contact 56B can be over Mx 10.

Using processes and materials previously discussed with respect to FIG. 2, MRAM 60 is formed over metal contact 56B. MRAM 60 is essentially the same as MRAM device 20 except that MRAM 60 resides over multichannel TFT 50. MRAM 60 can be composed of top electrode 68, freelayer 67, tunneling barrier 66, reference layer 65 and bottom electrode 63. MRAM 60 can be formed with the same processes, materials and similar dimensions to MRAM device 20. ILD 61 can be deposited over MRAM 60 and metal contact 56A connecting to Mx 10 and metal contact 56B connecting to top electrode 68 in MRAM 60 may be formed.

Multichannel TFT 50 can provide high current drivability for semiconductor structure 500. For example, using multiple ITO channels 52, multichannel TFT 50 can move more current and therefore, can have a smaller width than a single channel TFT (e.g., TFT 40 in FIG. 2).

In some embodiments, multichannel TFT 50 resides in one of MOL or BEOL wiring. Similarly, MRAM 60 resides in one of MOL or BEOL wiring. In another embodiment, multichannel TFT 50 is over MRAM 60 (e.g., as depicted with TFT 40 over MRAM device 20 in FIG. 4). As discussed with reference to FIG. 1, MRAM device 20 can be another embedded memory device (e.g., a ReRAM or PCRAM replacing a DRAM or a SRAM).

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a metal layer in a first interlayer dielectric that is above a semiconductor device;
an embedded memory device on the metal layer with a first metal contact is surrounded by a second interlayer dielectric; and
a thin film transistor directly on the first metal contact is surrounded by a third interlayer dielectric that is over a portion of the embedded memory device and a portion of the first interlayer dielectric, wherein a first portion of a channel of the thin film transistor covered a gate structure, and wherein the channel is a layer of indium tin oxide.

2. The semiconductor structure of claim 1, wherein the semiconductor device is a front end of line (FEOL) semiconductor device and the embedded memory device and the thin film transistor are middle of the line (MOL) semiconductor devices.

3. The semiconductor structure of claim 1, wherein the semiconductor device is a front end of line (FEOL) semiconductor device and the embedded memory device and the thin film transistor are backend of the line (BEOL) semiconductor devices.

4. The semiconductor structure of claim 1, wherein the semiconductor device is a front end of the line (FEOL) semiconductor device and the embedded memory device is a MOL semiconductor device and the thin film transistor is a BEOL semiconductor device.

5. The semiconductor structure of claim 1, wherein the embedded memory device is a phase-change memory device.

6. The semiconductor structure of claim 1, wherein the embedded memory device is one of a magnetoresistive random-access memory device or a resistive random-access memory device.

7. The semiconductor structure of claim 1, wherein the metal layer in the first interlayer dielectric is a metal contact of the semiconductor device.

8. The semiconductor structure of claim 1, wherein a thickness the channel is in a range of three to thirty nanometers.

9. The semiconductor structure of claim 1, further comprises:
   a second contact on a second portion of the channel of the thin film transistor and a third contact on the first contact that contacts a side of a channel of the thin film transistor.

10. A semiconductor structure, comprising:
    a metal layer in a first interlayer dielectric that is above a semiconductor device;
    a thin-film transistor surrounded by a second interlayer dielectric is over the metal layer and over a portion of the first interlayer dielectric, wherein a channel of the thin-film transistor composed of indium tin oxide, wherein the thin film transistor is in one of a middle of line (MOL) wiring layer or a backend of line (BEOL) wiring layer;
    the channel of the thin film transistor is over the metal layer and a portion of the first interlayer dielectric;
    a gate structure surrounded by a metal contact is over a portion of the channel of the thin-film transistor; and
    an embedded memory device over the metal contact surrounded by a third interlayer dielectric, wherein the embedded memory device is in one of a middle of line (MOL) wiring layer or a backend of line (BEOL) wiring layer.

11. The semiconductor structure of claim 10, wherein the thin film transistor and the embedded memory device are middle of line (MOL) semiconductor devices.

12. The semiconductor structure of claim 10, wherein the semiconductor device is a front end of line (FEOL) semiconductor device and the embedded memory device and the thin film transistor are backend of line (BEOL) semiconductor devices.

13. The semiconductor structure of claim 1, wherein the semiconductor device is a front end of the line (FEOL) semiconductor device and the thin film transistor is a MOL semiconductor device and the embedded memory device is a BEOL semiconductor device.

14. The semiconductor structure of claim 1, wherein the embedded memory device is one of a phase-change memory device, a magnetoresistive random-access memory device or a resistive random-access memory device.

15. The semiconductor structure of claim 10, wherein a thickness the channel is in a range of three to thirty nanometers.

* * * * *